(12) United States Patent
Lin et al.

(10) Patent No.: US 7,603,640 B2
(45) Date of Patent: Oct. 13, 2009

(54) MULTILEVEL IC FLOORPLANNER

(75) Inventors: Shyh-Chang Lin, Hsin-Chu (TW);
Tung-Chieh Chen, Taipei (TW);
Yao-Wen Chang, Taipei (TW)

(73) Assignee: Springsoft, Inc., Hsinchu (TW)

( * ) Notice: Subject to any disclaimer, the term of this patent is extended or adjusted under 35 U.S.C. 154(b) by 465 days.

(21) Appl. No.: 11/550,487

(22) Filed: Oct. 18, 2006

(65) Prior Publication Data

US 2008/0155485 A1 Jun. 26, 2008

Related U.S. Application Data

(60) Provisional application No. 60/808,765, filed on May 26, 2006.

(51) Int. Cl.
 *G06F 17/50* (2006.01)
(52) U.S. Cl. ............ 716/7; 716/8; 716/9; 716/10; 716/11
(58) Field of Classification Search .......... 716/7–11
See application file for complete search history.

(56) References Cited

U.S. PATENT DOCUMENTS

2006/0190889 A1* 8/2006 Cong et al. ............ 716/8
2007/0245281 A1* 10/2007 Riepe et al. ............ 716/9

OTHER PUBLICATIONS

Nakatake et al.,"Module Packing Based on the BSG-Structure and IC Layout Applications", Jun. 1998, IEEE Transactions on Computer-Aided Design of Integrated Circuits and Systems, vol. 17, No. 6, pp. 519-530.*

Chang et al., "B*-Trees: A New Representation for Non-Slicing Floorplans", 2000, Proceedings—Design Automation Conference, pp. 458-463.*

Adya et al., "Fixed-outline Floorplanning Through Better Local Search", 2001, Proceedings—International Conference on Computer Design, pp. 328-334.*

Ranjan et al., "Fast Floorplanning for Effective Prediction and Construction", 2001, IEEE Transactions on VLSI Systems, pp. 341-351.*

Chang et al., "Multi-level Placement for Large-Scale Mixed-Size IC Designs", 2003, Proceddings—Asia South Pacific Design Automation Conference, pp. 325-330.*

(Continued)

*Primary Examiner*—Sun J Lin
(74) *Attorney, Agent, or Firm*—Smith-Hill & Bedell, P.C.

(57) ABSTRACT

To generate a floorplan for an integrated circuit to be formed by a collection of modules interconnected by nets, the floorspace to be occupied by the integrated circuit is partitioned into regions and all of the modules are allocated among those regions. The regions are then iteratively partitioning into smaller progressively smaller regions with modules previously allocated any partitioned region allocated among the regions into which it was partitioned, until each region of the floorplan has been allocated no more than a predetermined maximum number of modules. A separate floorplan is then generated for each region. Neighboring regions are then iteratively merged to create progressively larger regions, until only a single region remains, wherein upon merging any neighboring regions to form a larger merged region, the floorplans of the neighboring regions are merged and refined to create a floorplan for the merged region.

30 Claims, 6 Drawing Sheets

OTHER PUBLICATIONS

Khatkhate et al., "Recursive Bisection Based Mixed Block Placement", 2004, Proceddings—International Symposium on Phys. Design, 6 pages.*

Cong et al., "Robust Mixed-Size Placement Under Tight White-Space Constraints", Nov. 2005, Proceedings—IEEE/ACM International Conference on Computer Aided Design, 8 pages.*

* cited by examiner

MULTILEVEL IC FLOORPLANNER

CROSS-REFERENCE TO RELATED APPLICATION

This application claims benefit of the date of filing of U.S. Provisional Application No. 60/808,765 filed May 26, 2006, the entire disclosure of which is incorporated herein by reference for all purposes.

BACKGROUND OF THE INVENTION

1. Field of the Invention

The invention relates to a computer-based IC floorplanner that iteratively partitions IC floorspace into progressively smaller regions, allocating IC modules to regions after each partitioning until the regions are sufficiently small, creates a separate floorplan for each small region, and then iteratively merges and refines floorplans for neighboring regions to obtain a single floorplan for the entire IC floorspace.

2. Description of Related Art

An integrated circuit (IC) designer typically generates a text-based netlist describing an IC as a hierarchy of modules formed by instances of various components (cells) interconnected by signal paths (nets) formed by conductors residing on various horizontal layers of the IC and by conductive "vias" passing vertically between layers. As illustrated in FIG. 1, a netlist is typically hierarchical in nature with cells instances 10 being organized into low level modules 12 and lower level modules being organized into higher level modules 14 and 15. FIG. 1 depicts a simple design having four hierarchal levels 16-19 with varying numbers of cell instances 10 (represented by circles) and modules 14 (represented by squares) at each level. A more complex design will include more cell instances and modular levels. Although an IC may include many modules formed by instances of standard cells such as transistors and logic gates, an IC may also include "intellectual property" (IP) modules implementing large devices such as memories and microprocessors.

After creating the netlist, the designer employs computer-aided placement and routing (P&R) tools to produce an IC layout including a placement plan indicating a position for each component and a routing plan describing the routes and positions of conductors and vias forming the nets. The IC layout guides IC fabrication.

The number of components included in an IC continues to grow dramatically as nanometer IC technologies continue to shrink components, and while modern ICs can include millions of transistors, ICs with billions of transistors are on the horizon. Since the time required for placement and routing tools to generate an IC layout increases with the number of components in the design, using large IP modules in large-scale IC designs can help to reduce the number of components that have to be placed and therefore the time required to generate an IC layout. However large, inflexible IP modules can also make it more difficult for a placement and routing tool to place and route remaining portions of an IC.

A typical P&R tool initially generates an initial floorplan allocating a separate area of an IC's floor space to various modules of an IC and then generates placement and routing plans for each area. Placement and routing is typically an iterative process. After creating a floorplan and then creating a placement plan consistent with the floorplan, a P&R tool attempts to create a routing plan, and if it is unable to develop a suitable routing plan for that placement plan, it will modify the placement plan and again attempt to develop suitable routing plan. If the P&R tool cannot find a suitable placement and routing solution for a given floorplan, it will modify the floorplan and attempt placement and routing again. The ability of a P&R tool to quickly find a suitable layout solution greatly depends on how well the initial floorplan anticipates the floorspace requirements of each IC module and the net routing requirements between the modules.

Floorplanning algorithms continue to evolve to meet the challenges presented constantly increasing design complexity. As illustrated in FIG. 2A, a hierarchical floorplanner partitions the IC floor space into a set of regions 20, each sized and positioned as necessary to accommodate an estimated size of a separate module at a high level of the design hierarchy. For example, since the design of FIG. 1 has seven modules at level 17, a hierarchical floorplanner could estimate the size of each cell instance or module at that level and establish a corresponding region 20 for each module. Sizes and shapes of cells and IP modules are known, and a floorplanning algorithm can estimate the size and shape of an area needed for each custom module based on the known areas of the cells that form it. As illustrated in FIG. 2B, the hierarchal floorplanner then further partitions the region 20 assigned to each custom module into a set of subregions 22, each sized and positioned to accommodate sub modules or cell instances forming that model at a next lower level of the design hierarchy. The subdivision process continues recursively until the IC floorspace has been partitioned into small regions for accommodating modules and cell instances at a desired low level of the design hierarchy. Such a top-down hierarchical floorplanner can quickly and efficiently generate a floorplan providing sufficient space for each cell or module of a large-scale design but will often produce an unroutable placement plan because it does not directly take into account routing requirements between modules when generating a floorplan.

A typical prior art multilevel floorplanning framework as illustrated in FIGS. 3A-3F takes a bottom-up/top-down approach to determining a suitable size, shape, orientation and position for each area of a floorplan. Initially viewing the IC at a low level of the design hierarchy at the start of a "clustering" phase of the process, the floorplanner groups highly interconnected low level modules and cell instances into a set of small clusters and provides a suitably sized region 24 for each cluster (FIG. 3A). As illustrated in FIG. 3B, highly interconnected regions 24 are then merged to form larger regions 25 with the clusters within each larger region 25 arranged to limit the lengths of nets that will interconnect them. The iterative merging process continues in a similar manner to form progressively larger regions 26 (FIG. 3C) until all clusters have been merged and suitably arranged into a single region 27 (FIG. 3D).

At this point the floorplanner begins an iterative declustering process wherein it partitions regions into progressively smaller regions that are rearranged as necessary to best fit within the boundary 29 of the IC placement area. FIG. 3E shows that region 27 of FIG. 3D has been partitioned into a set of smaller regions 28 which have been arranged to fit as closely as possible within placement area boundary 29. FIG. 3F shows the result of partitioning various regions 28 into smaller regions and rearranging them to fit within the placement area boundary 29. The floorplanning process ends when the regions 30 are of a desired small size and fit within the IC placement area boundary 29. The boundaries of regions 30 define the floorplan for subsequent placement and routing processes.

The multilevel floorplanning framework illustrated in FIGS. 3A-3F is known as the "V-Cycle" framework, but it may be more descriptively called a "Λ-shaped" framework since it includes an initial bottom-up clustering phase followed by a top-down declustering phase. A P&R tool employing a Λ-shaped floorplanning framework to produce a floorplan can normally derive a placement plan consistent with the floorplan, but it often fails to produce a suitable routing plan because it fails to find suitable routes for the longer nets. Since the Λ-shaped framework initially operates in a bottom-up manner, clustering and arranging modules based on considerations of shorter nets rather than on longer nets, wrong choices early in the clustering process can make longer nets longer, thereby resulting in a suboptimal the floorplan solution during the declustering process. In order to reduce the likelihood that a floorplan will lead to an unroutable placement plan, it would be helpful to take the longer interconnections between modules into account earlier in the floorplanning process.

SUMMARY OF THE INVENTION

The invention relates to a method for generating a floorplan for an integrated circuit formed by a collection of modules interconnected by nets. A floorplanner employing the method initially partitions floorspace to be occupied by the IC into a set of regions and allocates all of the modules among those regions. The floorplanner then iteratively partitions each region into progressively smaller regions, allocating modules it previously allocated to any partitioned region among its partition regions in a way that is biased toward reducing lengths of nets terminating on those modules and toward balancing space requirements of modules assigned to each region. The partitioning phase of the floorplanning process ends when no region of the floorplan has been allocated more than a predetermined maximum number of modules.

The floorplanner then generates a separate floorplan for each region and thereafter iteratively merges neighboring clusters of regions to create progressively larger regions. Upon merging any regions to form a larger merged region, the floorplanner also merges the floorplans of the neighboring regions and refines the result to produce a floorplan for the merged region. Whenever merging floorplans for neighboring regions, the floorplanner refines the merged floorplan, for example by changing the aspect ratios and positions of its subregions to reduce a cost function, preferably a weighted combination of the lengths of nets terminating on modules allocated to the merged regions, of the area of the floorplan for the merged regions, and of a difference between aspect ratios of that floorplan and the merged region.

The floorplanning process ends when the floorplanner has merged all of the regions into a single region covering the available IC floorspace, and has merged and refined all of its subregion floorplans to produce a single floorplan for that single, large region.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

The invention relates to a method for generating an IC floorplan allocating separate areas of IC floorspace to various modules of an IC described by a netlist. The method is suitably implemented by software residing on computer-readable media such as, for example, a hard disk, a compact disk, or read only or random access memory, which when read and executed by a conventional computer, causes the computer to carry out the method. Although the description of a preferred embodiment of the invention is highly detailed in order to facilitate understanding of that embodiment of the invention, those of skill in the art will understand that other embodiments of the invention may differ in many respects from the preferred embodiment, and need not necessarily include all details of the following description.

Figure 4:
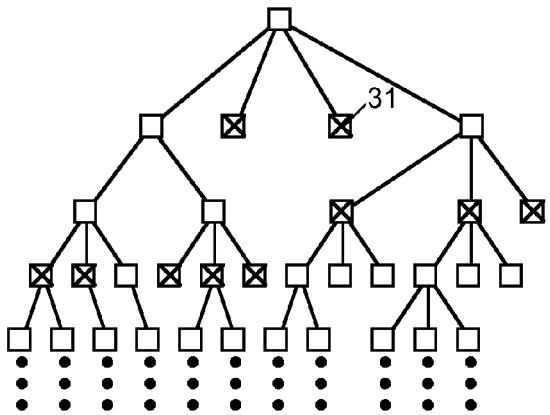
FIG. 4 depicts a portion of a hierarchical IC design in block diagram form.

As illustrated in FIG. 4, a netlist describes an IC as a hierarchy of modules 31, wherein modules at any level of the design hierarchy are formed by modules and/or cell instances at a lower level of the design hierarchy. A floorplanner in accordance with the invention generates a floorplan reserving particular regions of an IC layout for selected modules of the design. After determining the size and shape of the available IC floorspace, the floorplanner iteratively partitions the floorspace into progressively smaller regions until no region holds more than a specified maximum number of modules. Whenever the floorplanner partitions a larger region into two smaller regions, it allocates IC modules previously allocated to the larger region between the smaller regions in a manner that is biased toward minimizing the lengths of nets that interconnect the modules and toward balancing estimated space requirements of the modules allocated to the regions. After the partitioning phase, the floorplanner creates a separate floorplan for each small region, attempting to find a unique position for each module allocated to the region within the boundaries of that region, though the floorplan for each region may overlap its boundaries if necessary. The floorplanner then iteratively merges neighboring pairs of regions, combining and adjusting their floorplans to eliminate module overlaps after each merger, until all regions have been merged into a single region and all overlaps have been eliminated.

Figure 1:
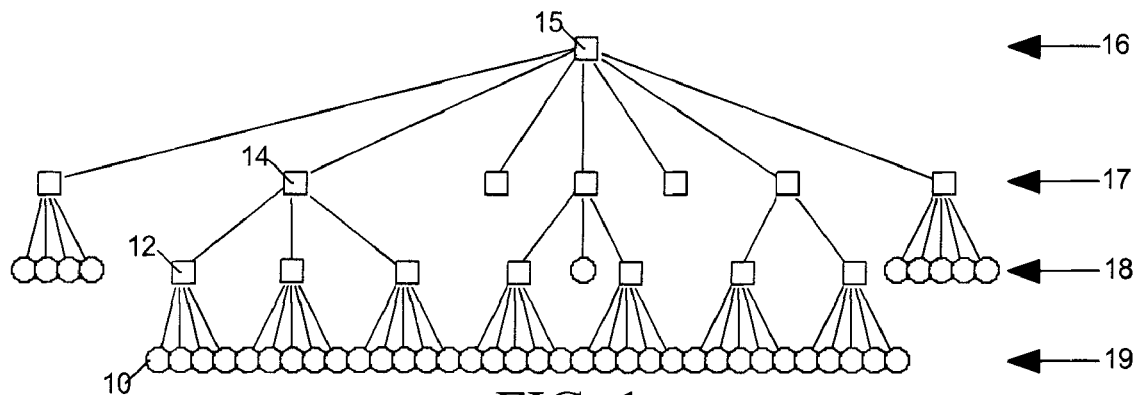
FIG. 1 depicts a hierarchical integrated circuit (IC) design in block diagram form.
Figure 2A:
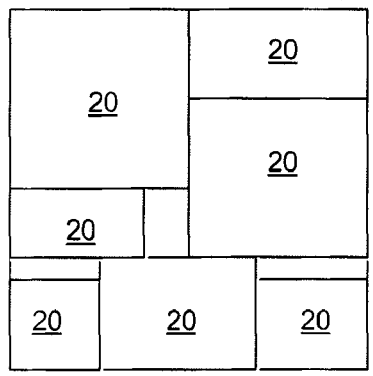
FIGS. 2A and 2B depict successive stages of an IC floorplan created in accordance with a prior art floorplanning method.
Figure 2B:
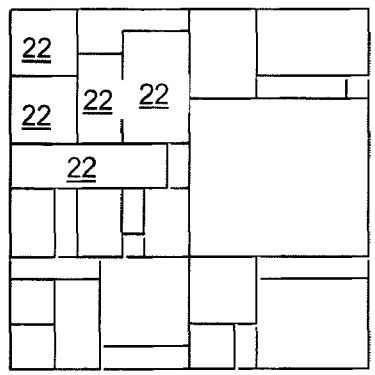
Figure 3C:
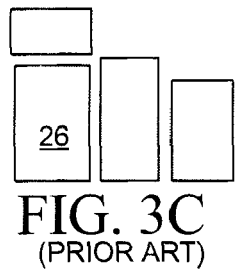
FIG. 3A-3F depict successive stages of an IC floorplan created in accordance with another prior art floorplanning method.
Figure 3D:
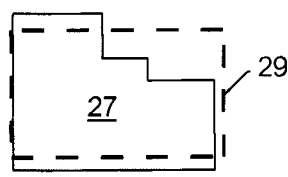
Figure 3B:
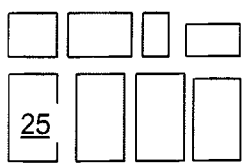
Figure 3E:
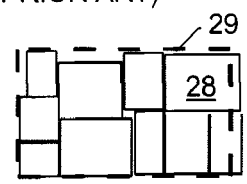
Figure 3A:
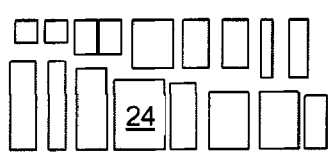
Figure 3F:
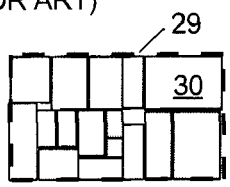
Figure 5:
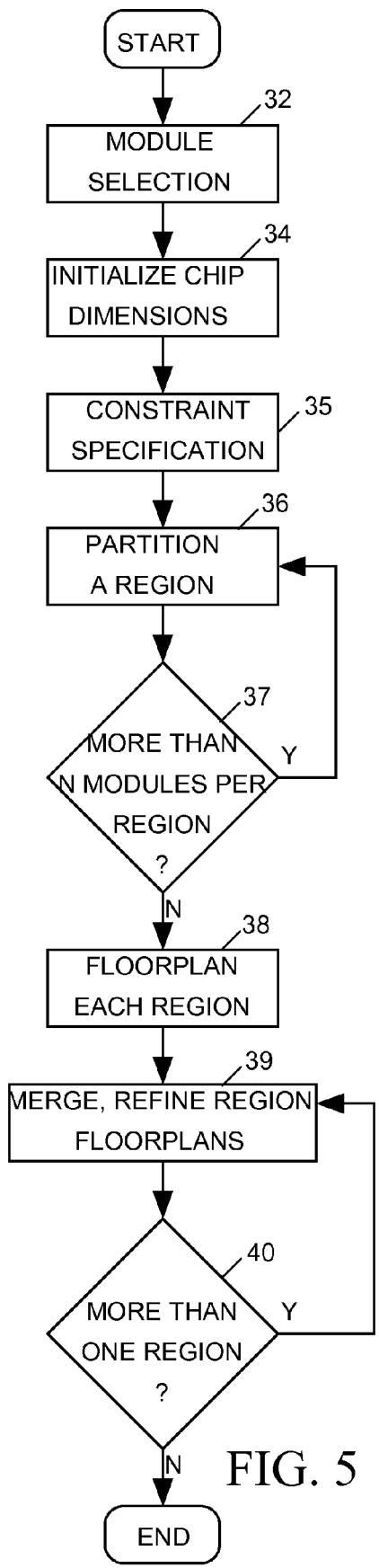
FIG. 5 is a flow chart depicting a method in accordance with the invention for generating an IC floorplan.

FIG. 5 is a flow chart depicting an algorithm employed by a floorplanner in accordance with the invention. The floorplanner initially obtains input from a user selecting the modules that are to be assigned to separate areas (step 32). For example, the user may select modules of FIG. 4 that are marked with an "X". The modules need not all be on the same hierarchal level. The floorplanner then estimates suitable height and width dimensions (H, W) for the entire IC layout area (step 34). To do so, the floorplanner first estimates the total chip area A that will be occupied by the modules based on the known dimensions of any IP modules for and on the dimensions of cell instances forming all other modules having flexible dimensions. Given user-provided data specifying a maximum white-space fraction γ, (i.e. a maximum allowable unused fraction of the floorplan) and a desired layout area (height/width) aspect ratio α, the floorplanner determines the height and width of the area using the following equations:

$$H^* = \sqrt{(1+\gamma)A\alpha},$$

$$W^* = \frac{(1+\gamma)A}{H^*}.$$

If the floorplanner finds that the maximum horizontal or vertical dimension max($H_i,W_i$) of any fixed-size IP module $m_i$ is larger than either of the above computed horizontal or vertical dimension of the IC layout area, it re-computes the chip dimensions at step 34 as follows:

$$H^* = \max(W_i, H_i),$$

$$W^* = \frac{(1+\gamma)A}{H^*}.$$

The re-computed chip dimensions ensure that no module is too large in any dimension to fit within the layout area. Note that the chip area $$A^*=H^*W^*=(1+\gamma)A$$

remains unchanged from its original formulation.

Figure 6:
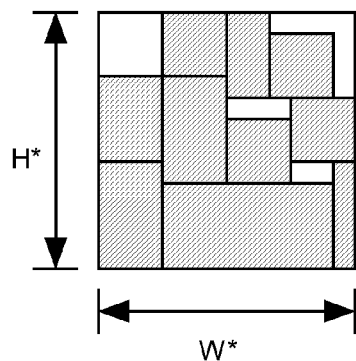
FIGS. 6 and 7 depict alternative IC floorplans.
Figure 7:
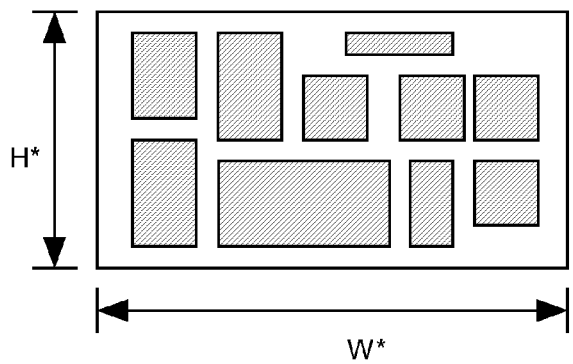

FIG. 6 shows an example floorplan in which aspect ratio α=1 and white-space fraction γ=0.15. FIG. 7 shows an example floorplan in which α=0.6 and white-space fraction γ=0.8.

Constraint Specification

Referring again to FIG. 5, at step 35 the user supplies information specifying any constraints on the layout. For example, the user may specify positions within the placement area of bonding pads for each of the chip's external terminals, may specify that one or more modules must be placed at certain positions within the placement area, and may specify limits on the sizes or aspect ratios (height/width) of certain modules. Other types of placement constraints are possible.

Iterative Partitioning

The floorplanner then generates a floorplan for the available portion of the IC layout area for which the user did not reserve for specific module placement at step 35. To do so, the floorplanner first carries out an iterative process (steps 36 and 37) in which it partitions the available portion of the IC's floorspace into progressively smaller regions (step 36) allocating modules between the smaller regions after each partitioning until each region is sufficiently small (step 37). A region is considered "sufficiently small" if it has been allocated no more than a specified maximum number of modules. As described below, whenever the floorplanner partitions a region into two smaller regions, it allocates modules between the two smaller regions in a way that is biased toward minimizing the lengths of nets connected to the modules assigned to each smaller region and also toward balancing the estimated total space requirements of all modules allocated to each smaller region. Module allocation is also subject to any placement constraints specified at step 35. For example, if a constraint requires that a particular module must be centered at a specific position within the IC placement area, the floorplanner always allocates that module to the region surrounding that position after each partitioning.

Figure 8A:
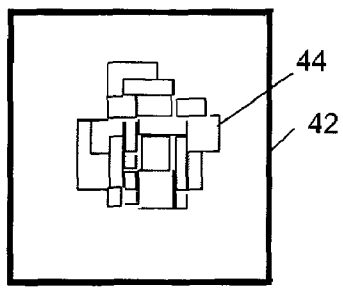
FIG. 8A-8H depict successive stages of an IC floorplan created in accordance the method of FIG. 5.
Figure 8H:
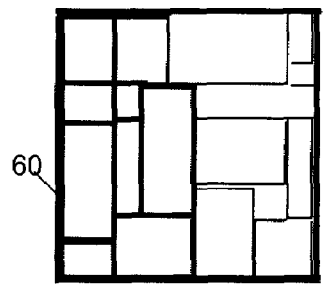
Figure 8B:
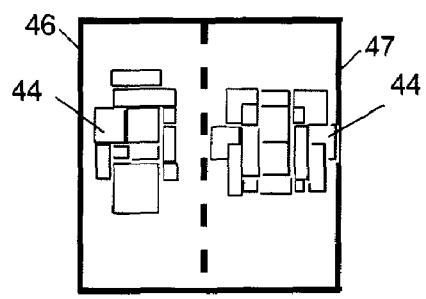
Figure 8G:
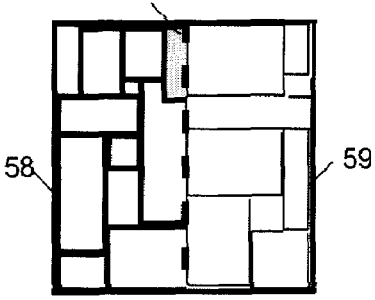
Figure 8C:
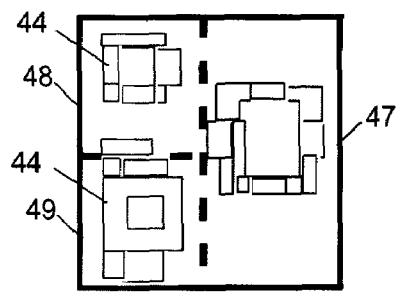
Figure 8F:
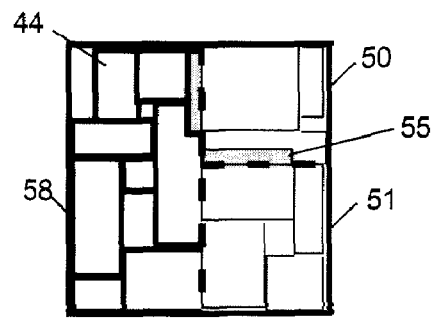
Figure 8D:
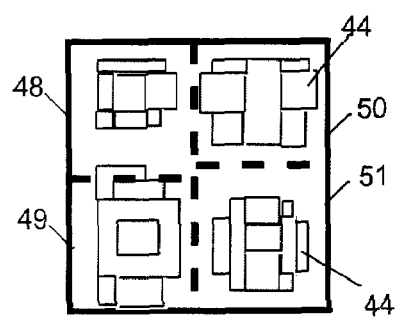

FIGS. 8A-8D illustrate an example of the interactive partitioning process carried out at steps 36 and 37. As shown in FIG. 8A, the floorplanner initially treats the available layout area as a single placement region 42, and assigns all modules 44 to that region. The floorplanner makes no attempt to find a separate position for each module or module 44 within region 42; it simply assumes centers of all modules reside at the center of the region. At step 36, the floorplanner then divides region 42 into two regions 46 and 47 as shown in FIG. 8B and allocates modules 44 between the two regions (step 36) subject to any placement constraints imposed at step 35. Since region 46 holds more than the specified maximum number of modules 44 (step 37), the floorplanner divides region 46 into two regions 48 and 49 as shown in FIG. 8C and allocates the modules previously assigned to region 46 between the two new regions 48 and 49 (step 36). Subject to any placement constraints imposed at step 35 the floorplanner allocates modules 44 between the two regions 48 and 49 in a way that is biased toward minimizing lengths of nets passing between the two regions and toward balancing estimated floorspace requirements of the modules assigned to the two regions. Since region 47 also holds more than the specified maximum number of modules 44 (step 37), the floorplanner also divides region 47 into two regions 50 and 51 as illustrated in FIG. 8D and allocates the modules 44 previously assigned to region 47 between the two new regions 50 and 51 (step 36) in a similarly biased manner. The partitioning phase of the process ends at this point (step 37) because no region 48-51 holds more than the specified number of modules 44.

Iterative Area Floorplanning and Merging

Figure 8E:
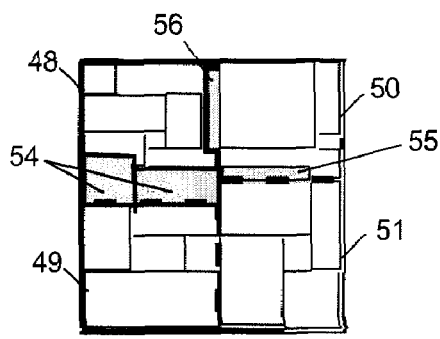

Referring back to FIG. 5, after iteratively partitioning the available layout area into several small regions and allocating modules 44 to each region, the floorplanner next (step 38) uses any suitable conventional floorplanning technique to generate a separate floorplan for each region 48-51 attempting to find a position within the region for each module 44 assigned to that region as illustrated in FIG. 8E. To make modules 44 fit within any region 48-51, the floorplanner may adjust the shape of an area occupied by any module subject to any constraints on its aspect ratio, and may reposition any module subject to any constraints on its position. When it is not possible to fit all of the modules 44 within a given region, the floorplanner may allow the floorplan for that region to extend beyond that region's boundaries. For example FIG. 8E shows areas 54 where modules assigned to region 49 overlaps modules in region 48, an area 55 in which a module assigned to region 51 overlaps modules in region 50, and an area 56 in which a module assigned to region 50 overlaps modules in region 48.

Referring again to FIG. 5, the floorplanner now carries out another iterative process (steps 38 and 39) in which it successively merges neighboring pairs of regions combining, merging and refining their floorplans as necessary to eliminate module overlaps (step 38). For example FIG. 8F shows a resulting floorplan after a first pass through step 39 wherein the floorplanner has merged regions 48 and 49 of FIG. 8E to form a single larger region 58 and has merged and refined their floorplans to eliminate the areas of overlap 54 between the modules assigned to regions 48 and 49 of FIG. 8E. FIG. 8G shows a resulting floorplan after a second pass through step 39 wherein the floorplanner has merged regions 50 and 51 of FIG. 8F to form a single larger region 59 and has merged and refined their floorplans to eliminate the areas 55 of overlap between the modules assigned to regions 50 and 51 of FIG. 8F. FIG. 8G shows a resulting floorplan after a third and final pass through step 39 wherein the floorplanner has merged regions 58 and 59 of FIG. 8G to form a single larger region 60 as illustrated in FIG. 8H and has merged and refined their floorplans to eliminate the area 56 of overlap between the modules assigned to regions 58 and 59 of FIG. 8G. The floorplanning process ends when only one large region 60 remains and all overlaps have been eliminated (step 40).

Terminal Propagation

Figure 9:
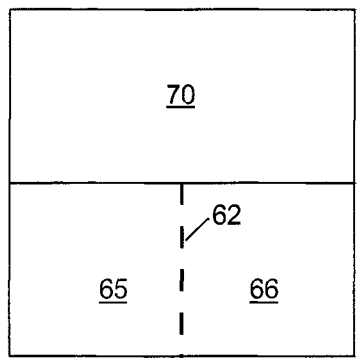
FIGS. 9 and 10 depict a floorplan partitioned into three areas.

At each pass through step 36 of FIG. 5 during the partitioning phase of the floorplanning process, the floorplanner partitions a larger region into two smaller regions and allocates the modules assigned to the larger region between the two smaller regions. To avoid creating regions of large aspect ratio, the floorplanner partitions the large region using cut lines perpendicular to its longest sides. For example as shown in FIG. 9, the floorplanner would partition a region 61 along cut-line 62 perpendicular to its longest sides to form smaller regions 65 and 66.

Figure 10:
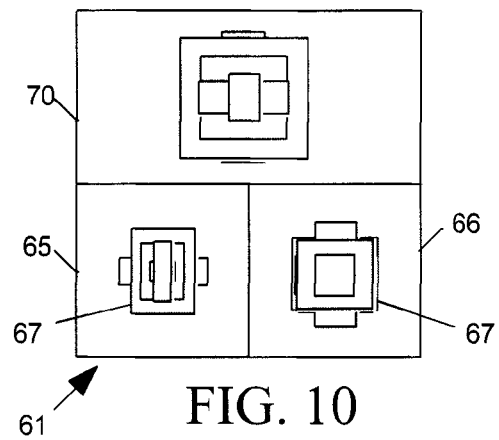

After the floorplanner creates smaller regions 65 and 66, it allocates the modules 67 previously assigned to larger region 61 between smaller regions 65 and 66 as illustrated in FIG. 10. Although it assumes each module resides at the center of its assigned region 65 or 66, the floorplanner estimates the space requirement of each module 67, and subject to any placement constraints on any particular modules, allocates modules 67 between regions 65 and 66 in a way that is biased toward balancing the floorspace requirements of the modules assigned to each region 65 and 66. The allocation of modules is also biased toward minimizing lengths of nets crossing region boundaries Referring to FIG. 11, assume a netlist indicates terminals of two modules B and C are to be interconnected to one another and to some other terminal A by a net 72 and that modules B and C are to be allocated between regions 65 and 66 after partitioning. Terminal A may, for example, be a terminal of a module assumed to be residing at the center of some other region or an IC I/O pad residing at some predetermined position in the layout that may or may not be with regions 65 and 66. Since the floorplanner could allocate modules B and C to regions 65 and 66, respectively (FIG. 11), or to regions 66 and 65, respectively (FIG. 12), or could allocate both modules B and C to either to region 66 (FIG. 13) or to region 65 (FIG. 14), it must choose one of those four alternatives.

Figure 11:
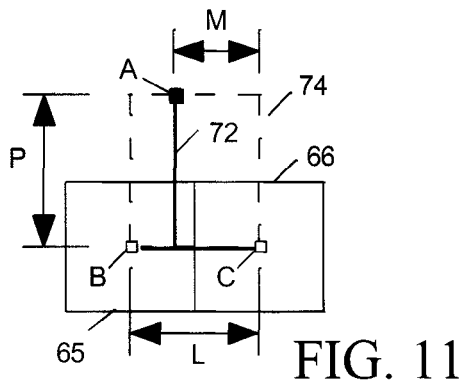
FIGS. 11 through 14 graphically depict bounding boxes of nets resulting from alternative allocations of two modules between two partitions.
Figure 12:
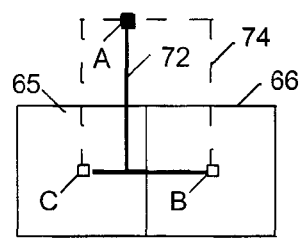
Figure 13:
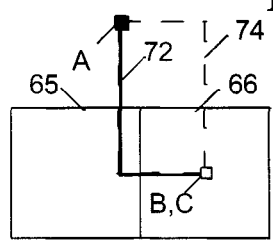
Figure 14:
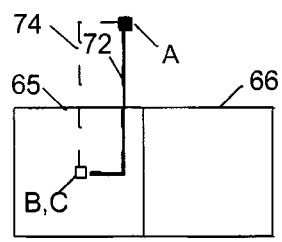

The conductors forming nets in an IC are normally horizontally routed only in orthogonal (X, Y) directions with horizontal placement area with the conductors residing on various layers of the IC being interconnected by vias vertically extending between the IC layers. A "bounding box" 74 of net 72 is the smallest rectangular box having sides extending in the orthogonal (X, Y) directions that can bound all of the terminals interconnected by the net, Since net conductors are normally routed only in the orthogonal (X, Y) directions, the total length of net 72 (exclusive of via lengths) will be approximately equal to one half of the perimeter of its bounding box 74 regardless of the net's route. That distance is the "half-perimeter wirelength" (HPWL). If modules B and C are the only modules to be allocated between regions 65 and 66, the floorplanner would allocate each module to a different region as shown in FIG. 11 or FIG. 12 to best balance the amount of area within each region that is occupied by the modules. However if many other modules are also to be allocated between regions, 65 and 66, the floorplanner could choose any one of the alternatives of FIGS. 11-14 with respect to modules B and C, though it would be biased toward allocating both modules to region 65 as illustrated in FIG. 14, because this choice minimizes the HPWL for bounding box 74, thereby minimizing the expected length of the net 72 interconnecting modules B and C to one another and to terminal A. However the floorplanner must take into account the effects on HPWL of all nets connected to the modules to be allocated between two regions following a partitioning when deciding how to allocate those modules between those two regions. Accordingly, a floorplanner in accordance with the invention employs unified net-weight modeling to map the min-cut cost exactly to HPWL change in a hypergraph for multi-terminal nets.

Let weight $w_1$ be the HPWL when all modules B and C are placed in the region 65 nearest terminal A as shown in FIG. 14. Let weight $w_2$ be the HPWL when modules B and C are both placed in the region 66 most distant from terminal A. Let weight $w_{12}$ be the HPWL when modules B and C are placed in different regions 65 and 66 as shown in FIG. 11 or FIG. 12.

$$w1 = L - M + P$$

$$w2 = M + P$$

$$w12 = L + P = \text{HPWL}$$

Figure 15:
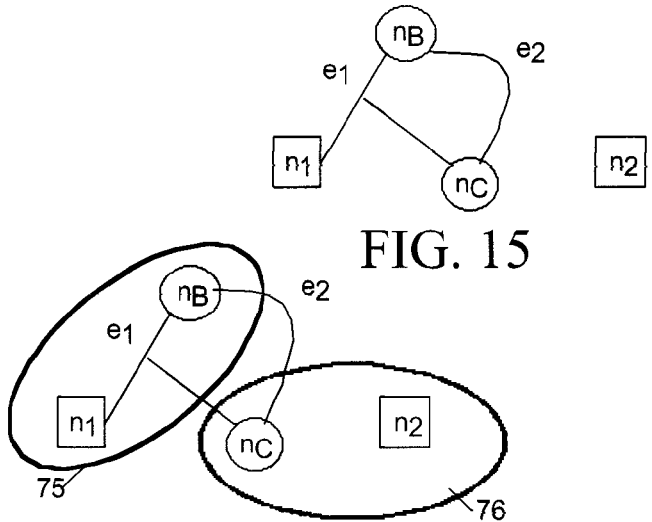
FIGS. 15-18 are graphs the floorplan of FIG. 11.

As illustrated in FIG. 15, the floorplanner introduces a hypergraph having two fixed nodes $n_1$ and $n_2$ representing the two regions 65 and 66, respectively, and having two movable nodes $n_B$ and $n_C$ representing the moveable modules B and C. A hyperedge $e_1$ connects the fixed node $n_1$ of region 65 to moveable nodes $n_B$ and $n_C$ and a hyperedge $e_2$ connects all moveable nodes $n_B$ and $n_C$. The floorplanner assigns a weight $(w_{12} - w_1)$ to hyperedge $e_1$ and a weight $(w_{12} - w_2)$ to hyperedge $e_2$. The floorplanner then determines whether to assign each module B and C to region 65 or 66 by investigating alternative approaches to partitioning the hypergraph of FIG. 15.

Figure 16:
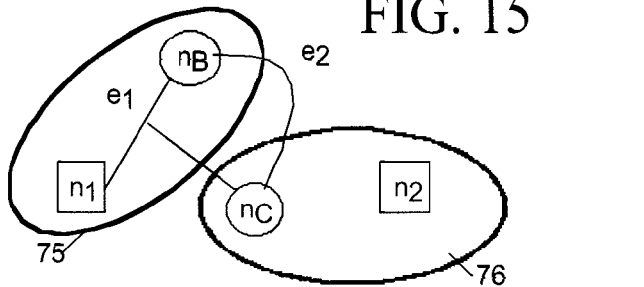

FIG. 16 illustrates a first alternative wherein the floorplanner partitions the hypergraph such that the node $n_1$ resides within a hypergraph partition 75 with node $n_B$ and node $n_2$ resides with node $n_2$ in another hypergraph partition 76. This partitioning corresponds to the module assignment of FIG. 11. The floorplanner computes a cost $n_{cut,1}$ of the partitioning as a sum of weighs associated with the vertices cut by the partitioning as follows:

$$\begin{aligned}n_{cut,1} &= w(e_1) + w(e_2) \\ &= (w_2 - w_1) + (w_{12} - w_2) \\ &= w_{12} - w_1 \\ &= HPWL_1 - w_1\end{aligned}$$

The cost for the graph partitioning corresponding to the module assignment of FIG. 12 is similar.

Figure 17:
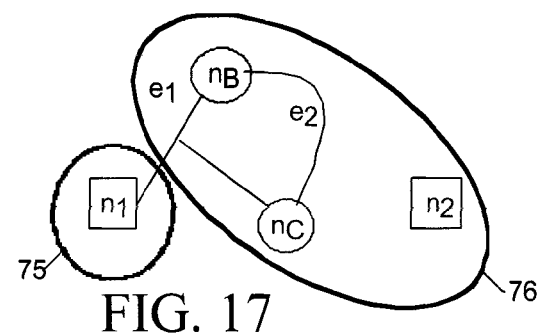

FIG. 17 illustrates a second alternative wherein the floorplanner partitions the of FIG. 15 such that the nodes $n_A$ and $n_B$ reside in partition 75 with node $n_2$, and node $n_1$ reside alone in partition 76. For this alternative, corresponding to the module assignment of FIG. 13, the floorplanner computes a cost $n_{cut,2}$ as follows:

$$n_{cut,2} = w(e_1)$$
$$= (w_2 - w_1)$$
$$= HPWL_2 - w_1$$

Figure 18:
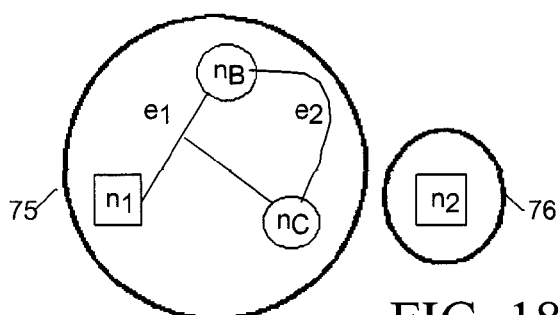

FIG. 18 illustrates a third alternative wherein the floorplanner partitions the hypergraph of FIG. 15 such that the nodes $n_A$ and $n_B$ reside with node $n_1$ in partition 76 and node $n_2$ resides in partition 75. For this graph partitioning, corresponds to the module assignment of FIG. 14, the floorplanner computes a cost $n_{cut,3}$ as follows:

$$n_{cut,3} = 0$$
$$= (w_1 - w_1)$$
$$= HPWL_3 - w_1$$

Based on the above analysis of the unified net-weight model, we have for any $i^{th}$ partitioning alternative, $$HPWL_i = w_1 + n_{cut,i}$$

and $$\min(\Sigma(HPWL_i)) = \Sigma(w_1) + \min(\Sigma(n_{cut,i}))$$

From this we can see that since $\Sigma(w_1)$ is a constant, finding a module allocation between partitions that minimizes $(\Sigma(n_{cut,i}))$ is equivalent to finding a solution that minimizes $\Sigma(HPWL_i)$. Thus the unified net-weight modeling exactly maps HPWL to min-cut cost. The floorplanner thus generates a net-weight hypergraph as illustrated, for example, in FIG. 15, and then investigates the hypergraph to determine the particular partitioning alternative that minimizes cost $\Sigma(n_{cut,i})$ Floorplan Merging and Refining At step 38 of FIG. 5, the floorplanner may use any suitable prior art floorplanning technique to produce a separate preliminary floorplan for each region of the IC placement area for the given module allocations at the end of the partitioning phase of the process. The floorplanner then optimizes the floorplan for each region to minimize a cost function that increases with the area occupied by the floorplan, with the lengths of nets terminating on the modules in the region and with the difference between aspect ratios of the floorplan and the region being floorplanned.

Figure 19:
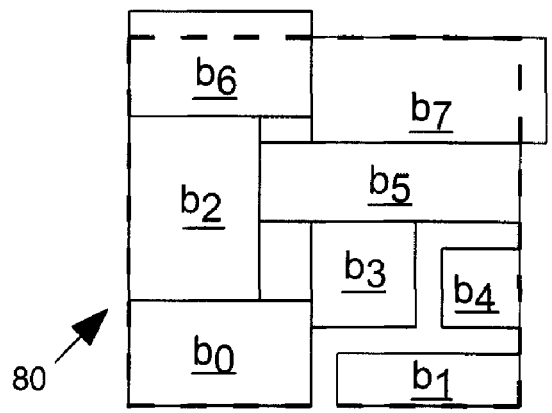
FIGS. 19-21 depict IC floorplans.
Figure 20:
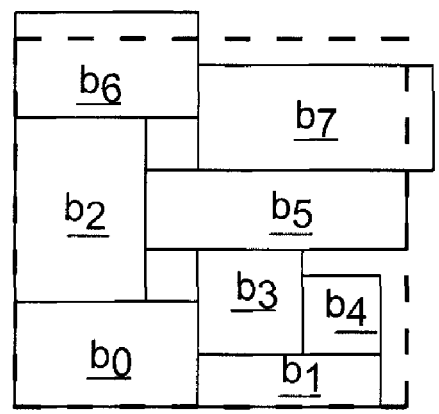

The paper "*B\*-trees: A New Representation for Non-Slicing Floorplans*" published by Chang et al in *Proceedings of the ACM/IEEE Design Automation Conference*, pages 458-463, in year 2000 (incorporated herein by reference) describes a suitable floorplan optimization method. Before using Chang's algorithm to optimize a floorplan for a region, the floorplanner should "pack" the floorplan to form an "admissible" floorplan wherein no module can be moved either down or to the left. For example FIG. 19 shows an inadmissible floorplan for a set of modules $b_0$-$b_7$ assigned to a region 80. FIG. 20 illustrates a resulting admissible floorplan for region 82 after the floorplan of FIG. 19 has been packed by moving modules down and to the left whenever possible. When possible, the floorplan for each region should reside fully within region boundaries, though as illustrated in FIG. 20, a region's floorplan may extend beyond region boundaries in order to satisfy various placement constraints.

Figure 21:
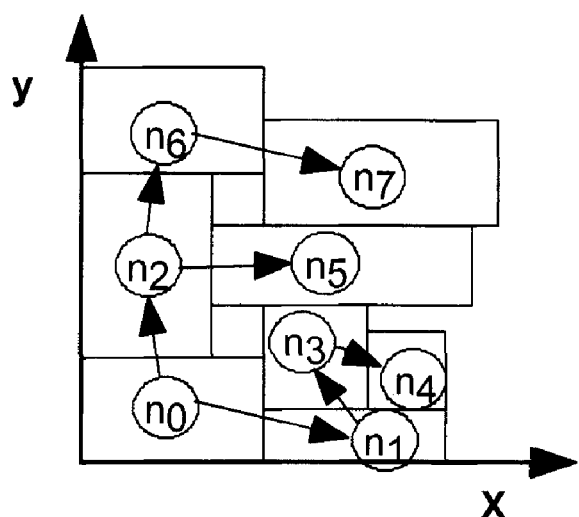
Figure 22:
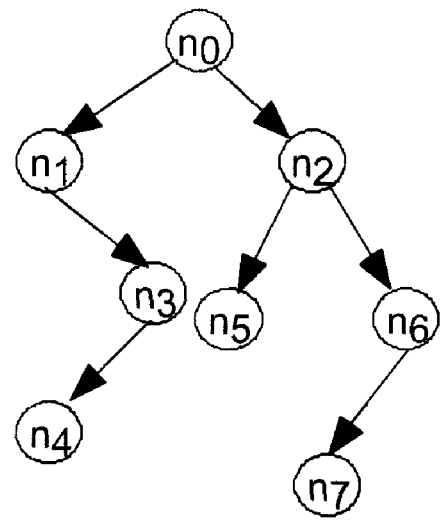
FIG. 22 is a graph representing the floorplan of FIG. 18.

Chang's algorithm constructs a unique "B\*-tree" as illustrated in FIGS. 21 and 22 to model an admissible floorplan. For each node $n_i$ corresponding to a block $b_i$, the left child node of ni represents the lowest, adjacent block on the right side of block $b_i$, while the right child node of $n_i$ represents the first block above block bi having the same left side x-coordinate.

After establishing the B\*-tree representation of the floorplan, the floorplanner iteratively perturbs the floorplan by changing the tree structures (e.g. swapping two nodes, move a node to another place), rotating modules or resizing soft modules to obtain another compacted floorplan, subject to any constraints, to find a floorplan that minimizes the following cost function $\Phi$ $$\Phi = k_1 \frac{A_F}{A_{F,norm}} + k_2 \frac{W_L}{W_{L,norm}} + k_3 \left( \frac{W_F}{H_F} - \frac{W_R}{H_R} \right)^2.$$

where $A_F$ is the current floorplan area, $A_{F,norm}$ is an area normalization factor, $W_L$ is a current wirelength ($\Sigma HPWL_i$) for all nets connected to modules allocated to the area), $W_{L,norm}$ is a wirelength normalization factor, $W_F$ is a current floorplan width, $H_F$ is the current floorplan height, $W_R$ is a width of the region, $H_R$ is a height of the region, and $k_1$, $k_2$, $k_3$ are predetermined, user-specified constants.

The first term of cost function $\Phi$ renders it an increasing function of the area occupied by the floorplan. The second term renders $\Phi$ an increasing function of the lengths of nets terminating on the modules in the region. The third term renders $\Phi$ an increasing function of difference between aspect ratios of the floorplan and the available placement region. To calculate the area/wirelength normalization factors, the floorplanner performs several iterations of random perturbations of the floorplan and then sets AF,norm ($W_{L,norm}$) to an average value of $A_F$ ($W_L$).

Using "accelerative fixed-outline floorplanning", the floorplanner initially sets $k_2$=0 so wirelengths do not affect the cost function, and then manipulates the B\*-tree representation of the floorplan to change module aspect ratios and positions to find floorplan that minimizes the cost function. The floorplanner then sets $k_2$ to its user-specified value and then again manipulates the B\*-tree to find a floorplan that minimizes the cost function when wirelengths are taken into account. By deferring time-consuming wirelength computations, the accelerative fixed-outline floorplanning approach reduces processing time without substantial loss of solution quality, especially for large-scale circuits. Although the floorplanner may not find a floorplan that fully resides within the region's bounding box, it keeps the floorplan solution with the lowest cost for use during the next refinement level, when the region is merged with another.

Figure 23:
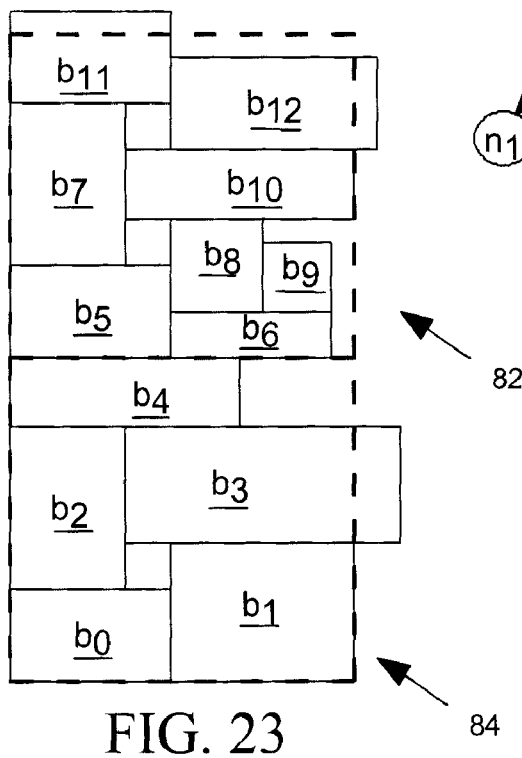
FIG. 23 depicts a floorplan of an IC region formed by merging two vertically adjacent smaller regions.
Figure 24:
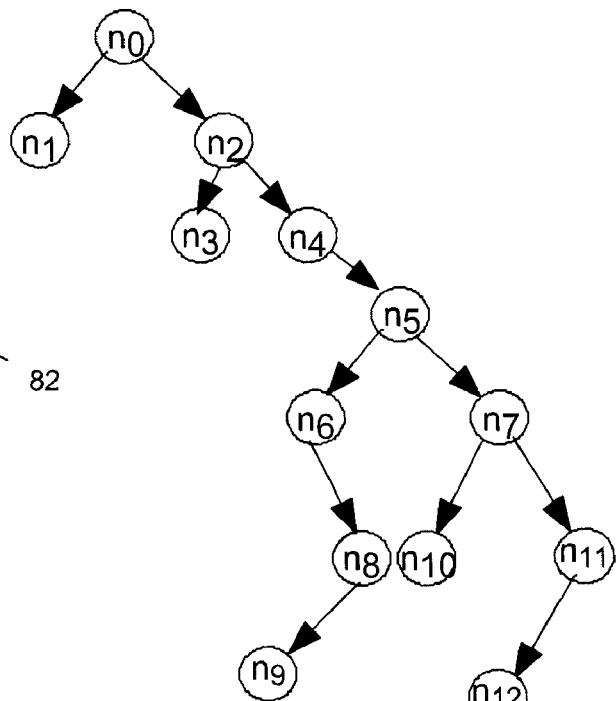
FIG. 24 is a graph representing the floorplan of FIG. 20.

After generating an optimized floorplan for each region at step 38 of FIG. 5, the floorplanner merges vertically or horizontally adjacent pairs of regions at each pass through step 39 by merging their floorplans and then refining the merged floorplan. To merge two vertical regions, the floorplanner makes the root of the B*-tree for the upper region floorplan the right child of the right-most node of the B*-tree for the bottom sub-floorplan. FIG. 23 shows two regions 82 and 84 that are to be merged. The floorplanner constructs the B*-tree of FIG. 24 by making the root $n_5$ of the B*-tree for the upper region 82 floorplan the right child of the right-most node $n_4$ of the B*-tree of the lower region 84 floorplan.

Figure 25:
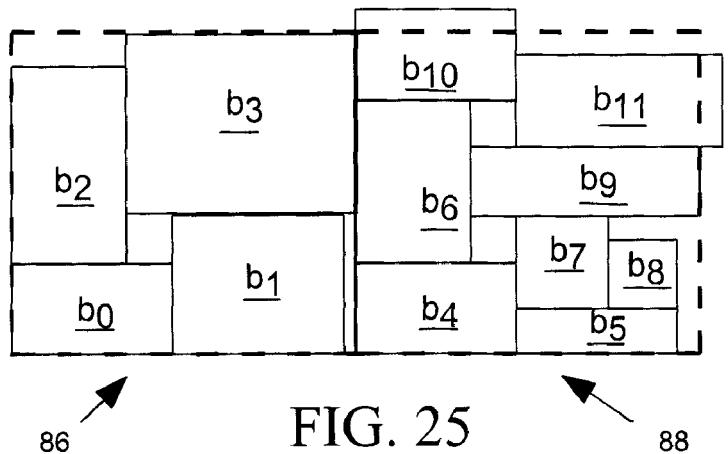
FIG. 25 depicts a floorplan of an IC region formed by merging two horizontally adjacent smaller regions.
Figure 26:
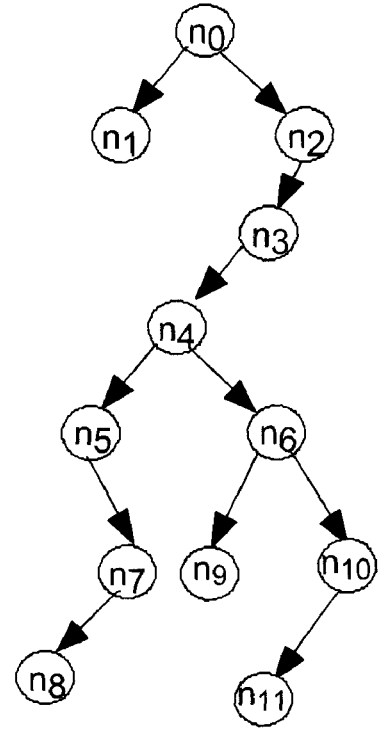
FIG. 26 is a graph representing the floorplan of FIG. 22.

To merge two horizontal regions, the floorplanner first finds the node corresponding to the right-most module of the left sub-floorplan and then makes the root of the B*-tree for the right sub-floorplan the left child of the node it found. For example, FIG. 25 shows an example in which two regions 86 and 88 are merged. As illustrated in FIG. 26, the root node $n_0$ of the B*-tree for the left region 86 floorplan becomes the root node of the B*-tree for the combined region floorplan and the root $n_5$ of the B*-tree for the floorplan of right region 88 becomes the left child of the left-most node $n_3$.

After merging the B*-trees for any two floorplans, the floorplanner employs the approach described by Chang to refine the floorplan for the combined region. Again using accelerative fixed-outline floorplanning to optimize the cost function, it initially sets $k_2=0$, manipulates the B*-tree representation of the merged floorplan to perturb module aspect ratios and positions to find floorplan that minimizes the cost function. The floorplanner then sets $k_2$ to its user-specified value and again manipulates the B*-tree to again find a floorplan that minimizes the cost function when wirelengths are taken into account.

Thus an interconnect-driven floorplanner employing a floorplanning method in accordance with the invention employs a V-shaped multilevel framework including an iterative partitioning stage followed by an iterative merging stage. The floorplanner preferable employs exact net weight modeling to allocate modules between regions after each region is portioned during the partitioning stage, and uses accelerative fixed-outline floorplanning after merging regions during the merging stage. Since the floorplanner scales well, it can be used for floorplanning circuits of increasing circuit size and complexity.

The invention is defined by the claims appended to this specification, and the following describes one particular mode of practicing the invention as recited in the claims appended to this specification. Although the following description includes numerous details in order to provide a thorough understanding of that particular mode of practicing the invention, it will be apparent to those of skill in the art that other modes of practicing the invention recited in the claims need not incorporate such details.

The invention claimed is:

1. A method for generating a floorplan for an integrated circuit to be formed by a collection of modules interconnected by nets, the method comprising the steps of:
   a. partitioning a floorspace to be occupied by the integrated circuit into regions and allocating all of the modules among those regions using a floorplanner running on a computer,
   b. iteratively partitioning the regions into progressively smaller regions using the floorplanner, wherein modules previously allocated to any region before being partitioned are allocated among the smaller regions into which said any region was partitioned; until each region of the floorspace has been allocated no more than a predetermined maximum number of modules,
   c. after step b, generating a separate floorplan for each region,
   d. iteratively merging neighboring regions until only a single region remains, wherein upon merging any neighboring regions to form a merged region, floorplans of the neighboring regions are merged and refined to create a floorplan for the merged region.

2. The method in accordance with claim 1 further comprising the steps of:
   e. estimating an area A of the floorspace to be partitioned at step a; and
   f. given a specified maximum allowable unused fraction of the floorplan γ and a specified floorplan aspect ratio α, computing a height H* and width W* of the floorspace to be partitioned at step a in accordance with the following expressions:

$$H^* = \sqrt{(1+\gamma)A\alpha},$$
$$W^* = \sqrt{(1+\gamma)A/\alpha}.$$

3. The method in accordance with claim 2 further comprising the step of:
   a3. when a maximum height or width dimension max($H_i$, $W_i$) of any fixed-size module i is larger than either H* or W* of the computed height or width dimension of the area A of the floorspace to be partitioned, re-computing H* and W* in accordance with the following expressions:

$$H^* = \max(W_i, H_i),$$
$$W^* = \frac{(1+\gamma)A}{H^*}.$$

4. The method in accordance with claim 1 wherein given each net terminating on a module allocated to any partitioned region is identified by a unique value of integer i, modules previously allocated to any region partitioned at step b, are allocated at step b among the smaller regions into which it was partitioned in a manner biased to minimize a sum of $HPWL_i$ for all i, subject to any constraints on module placement, wherein $HPWL_i$ is a half perimeter wirelength of net i, computed under an assumption that each termination of the i$^{th}$ net on any module resides at a center of the region to which the module is allocated.

5. The method in accordance with claim 4
   wherein $HPWL_i$ is computed as $w_i + n_{cut,i}$ for each net i,
   wherein $w_i$ is a smallest possible $HPWL_i$ for net i for a given module allocation among the smaller regions of the partitioned region, and
   wherein $n_{cut,i}$ is an increase in $HPWL_i$ over $w_i$ for net i for the module allocation between the smaller regions made at step c.

6. The method in accordance with claim 1 wherein step c comprises the substeps of, for each region,
   c1. generating a preliminary floorplan for the region, the preliminary floorplan comprising a separate area corresponding to and sized to accommodate each module assigned to the region; and
   c2. creating a separate graph for each region representing the preliminary floorplan of that region, wherein the graph for each region comprises a plurality of nodes and a plurality of edges, wherein each node of the graph for each region corresponds to a separate area to be occupied by a separate module allocated to that region, and wherein each edge of the graph for each region interconnects nodes and represents a physical connection between areas corresponding to the nodes it interconnects.

7. The method in accordance with claim 6 wherein step d comprises d1. upon merging any set of neighboring regions to form a merged region, merging graphs corresponding to that set of neighboring regions to form a graph representing a floorplan for the merged region, and d2. modifying the graph for each merged region when possible to reduce a value of a cost function associated with the floorplan of the merged region represented by the graph.

8. The method in accordance with claim 7 wherein step d further comprises:

d3. generating a floorplan for the single region that is consistent with its graph.

9. The method in accordance with claim 7 wherein the cost function is a function of lengths of nets terminating on modules corresponding to the nodes in the graph.

10. The method in accordance with claim 7 wherein the cost function is a function of an area of the floorplan the graph represents.

11. The method in accordance with claim 7 wherein the cost function is a function of a difference between an area of the merged region and an area of the floorplan for the merged region represented by the graph.

12. The method in accordance with claim 7 wherein the cost function is a function of lengths of nets terminating on modules corresponding to the nodes in the graph, of an area of the floorplan the graph represents, and of a difference between an aspect ratio of that floorplan and an aspect ratio of the merged region represented by the graph.

13. The method in accordance with claim 12 wherein step d2 comprises modifying the graph for each merged region when possible to reduce a weighted combination of the area of the floorplan the graph represents, and the difference between the area of that floorplan and an area of the merged region represented by the graph, and then further modifying the graph for said each merged region when possible to reduce a weighted combination of the lengths of nets terminating on modules corresponding to the graph nodes, the area of the floorplan the graph represents, and a difference between the area of that floorplan and an area of the merged region represented by the graph.

14. The method in accordance with claim 12 wherein the cost function $\phi$ is $$\Phi = k_1 \frac{A_F}{A_{F,norm}} + k_2 \frac{W_L}{W_{L,norm}} + k_3 \left(\frac{W_F}{H_F} - \frac{W_R}{H_R}\right)^2.$$

where $A_F$ is an area of a region,
where $A_{F,norm}$ is an area normalization factor,
where $W_L$ is the sum of $HPWL_i$ for all nets i terminating on modules assigned to the region,
where $W_{L,norm}$ is a wirelength normalization factor,
where $W_F$ is a width of a floorplan for the region,
where $H_F$ is a height of the floorplan for the region,
where $W_R$ is a width of the region,
where $H_R$ is a height of the region, and
wherein $k_1$, $k_2$, $k_3$ are constants.

15. The method in accordance with claim 14 wherein step d2 comprises modifying the graph for each merged region to minimize the cost function when $k_1$ and $k_3$ are non-zero and $k_2=0$ and then further modifying the graph for each merged region to minimize the cost function when $k_1$, $k_2$ and $k_3$ are all non-zero.

16. A computer-readable storage device, which when read and executed by a computer causes the computer to carry out a method for generating a floorplan for an integrated circuit to be formed by a collection of modules interconnected by nets, wherein the method comprises the steps of:

a. partitioning a floorspace to be occupied by the integrated circuit into regions and allocating all of the modules among those regions using a floorplanner running on a computer, b. iteratively partitioning the regions into smaller progressively smaller regions using the floorplanner, wherein modules previously allocated any region before being partitioned are allocated among the smaller regions into which said any region was partitioned; until each region of the floorspace has been allocated no more than a predetermined maximum number of modules, c. after step b, generating a separate floorplan for each region, d. iteratively merging neighboring regions until only a single region remains, wherein upon merging any neighboring regions to form a merged region, floorplans of the neighboring regions are merged and refined to create a floorplan for the merged region.

17. The computer-readable storage device in accordance with claim 16 wherein the method further comprises the steps of:

e. estimating an area A of the floorspace to be partitioned at step a; and f. given a specified maximum allowable unused fraction of the floorplan $\gamma$ and a specified floorplan aspect ratio $\alpha$, computing a height $H^*$ and width $W^*$ of the floorspace to be partitioned at step a in accordance with the following expressions:

$$H^* = \sqrt{(1+\gamma)A\alpha},$$
$$W^* = \sqrt{(1+\gamma)A/\alpha}.$$

18. The computer-readable storage device in accordance with claim 17 further comprising the step of:

a3. when a maximum height or width dimension $\max(H_i, W_i)$ of any fixed-size module i is larger than either $H^*$ or $W^*$ of the computed height or width dimension of the area A of the floorspace to be partitioned, re-computing $H^*$ and $W^*$ in accordance with the following expressions:

$$H^* = \max(W_i, H_i),$$
$$W^* = \frac{(1+\gamma)A}{H^*}.$$

19. The computer-readable storage device in accordance with claim 16 wherein given each net terminating on a module allocated to any partitioned region is identified by a unique value of integer i, modules previously allocated to any region partitioned at step b, are allocated at step b among the smaller regions into which it was partitioned in a manner biased to minimize a sum of $HPWL_i$ for all i, subject to any constraints on module placement, wherein $HPWL_i$ is a half perimeter wirelength of net i, computed under an assumption that each termination of the $i^{th}$ net on any module resides at a center of the region to which the module is allocated.

20. The computer-readable storage device in accordance with claim 19
wherein $HPWL_i$ is computed as $w_i + n_{cut,i}$ for each net i,
wherein $w_i$ is a smallest possible $HPWL_i$ for net i for a given module allocation
among the smaller regions of the partitioned region, and
wherein $n_{cut,i}$ is an increase in $HPWL_i$ over $w_i$ for net i for the module allocation between the smaller regions made at step c.

21. The computer-readable storage device in accordance with claim 16 wherein step c comprises the substeps of, for each region,
c1. generating a preliminary floorplan for the region, the preliminary floorplan comprising a separate area corresponding to and sized to accommodate each module assigned to the region; and
c2. creating a separate graph for each region representing the preliminary floorplan of that region,
wherein the graph for each region comprises a plurality of nodes and a plurality of edges,
wherein each node of the graph for each region corresponds to a separate area to be occupied by a separate module allocated to that region, and
wherein each edge of the graph for each region interconnects nodes and represents a physical connection between areas corresponding to the nodes it interconnects.

22. The computer-readable storage device in accordance with claim 21 wherein step d comprises
d1. upon merging any set of neighboring regions to form a merged region, merging graphs corresponding to that set of neighboring regions to form a graph representing a floorplan for the merged region, and
d2. modifying the graph for each merged region when possible to reduce a value of a cost function associated with the merged region floorplan represented by the graph.

23. The computer-readable storage device in accordance with claim 22 wherein step d further comprises:
d3. generating a floorplan for the single region that is consistent with its graph.

24. The computer-readable storage device in accordance with claim 22 wherein the cost function is a function of lengths of nets terminating on modules corresponding to the nodes in the graph.

25. The computer-readable storage device in accordance with claim 22 wherein the cost function is a function of an area of the floorplan the graph represents.

26. The computer-readable storage device in accordance with claim 22 wherein the cost function is a function of a difference between an area of the merged region and an area of the floorplan for the merged region represented by the graph.

27. The computer-readable storage device in accordance with claim 22 wherein the cost function is a function of lengths of nets terminating on modules corresponding to the nodes in the graph, of an area of the floorplan the graph represents, and of a difference between an aspect ratio of that floorplan and an aspect ratio of the merged region represented by the graph.

28. The computer-readable storage device in accordance with claim 22 wherein step d2 comprises
modifying the graph for each merged region when possible to reduce a weighted combination of the area of the floorplan the graph represents, and the difference between the aspect ratio of that floorplan and the aspect ratio of the merged region represented by the graph, and then
further modifying the graph for said each merged region when possible to reduce a weighted combination of the lengths of nets terminating on modules corresponding to the nodes in the graph, the area of the floorplan the graph represents, and the difference between the aspect ratio of that floorplan and the aspect ratio of the merged region represented by the graph.

29. The computer readable storage device in accordance with claim 27 wherein the cost function $\phi$ is $$\Phi = k_1 \frac{A_F}{A_{F,norm}} + k_2 \frac{W_L}{W_{L,norm}} + k_3 \left( \frac{W_F}{H_F} - \frac{W_R}{H_R} \right)^2 .$$

where $A_F$ is an area of a region,
where $A_{F,norm}$ is an area normalization factor,
where $W_L$ is the sum of $HPWL_i$ for all nets i terminating on modules assigned to the region,
where $W_{L,norm}$ is a wirelength normalization factor,
where $W_F$ is a width of a floorplan for the region,
where $H_F$ is a height of the floorplan for the region,
where $W_R$ is a width of the region,
where $H_R$ is a height of the region, and
wherein $k_1, k_2, k_3$ are constants.

30. The computer readable storage device in accordance with claim 22 wherein step d2 comprises
modifying the graph for each merged region to minimize the cost function when $k_1$ and $k_3$ are non-zero and $k_2=0$ and then
further modifying the graph for each merged region to minimize the cost function when $k_1$, $k_2$ and $k_3$ are all non-zero.

* * * * *